(12) United States Patent
Ahmed et al.

(10) Patent No.: US 6,845,017 B2
(45) Date of Patent: Jan. 18, 2005

(54) SUBSTRATE-LEVEL DC BUS DESIGN TO REDUCE MODULE INDUCTANCE

(75) Inventors: Sayeed Ahmed, Canton, MI (US); Scott Parkhill, Perrysburg, OH (US); Fred Flett, Bloomfield, MI (US); Douglas Maly, Canton, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 0 days.

(21) Appl. No.: 09/957,568

(22) Filed: Sep. 20, 2001

(65) Prior Publication Data

US 2002/0118560 A1 Aug. 29, 2002

Related U.S. Application Data

(63) Continuation-in-part of application No. 09/882,708, filed on Jun. 15, 2001, now abandoned.
(60) Provisional application No. 60/233,995, filed on Sep. 20, 2000, provisional application No. 60/233,996, filed on Sep. 20, 2000, provisional application No. 60/233,993, filed on Sep. 20, 2000, provisional application No. 60/233,992, filed on Sep. 20, 2000, and provisional application No. 60/233,994, filed on Sep. 20, 2000.

(51) Int. Cl.[7] ................................................. H01R 9/00
(52) U.S. Cl. ...................... 361/775; 361/764; 439/76.1; 257/691
(58) Field of Search .................................. 361/775, 764, 361/728, 752; 439/76.1, 76.2; 257/690–694, 723–724, 703–704, 678; 363/141

(56) References Cited

U.S. PATENT DOCUMENTS

| | | | | |
|---|---|---|---|---|
| 4,142,231 A | * | 2/1979 | Wilson et al. ............... 363/141 |
| 4,661,897 A | | 4/1987 | Pitel ............................ 363/17 |
| 4,674,024 A | | 6/1987 | Paice et al. .................. 363/71 |
| 5,184,291 A | | 2/1993 | Crowe et al. ................. 363/71 |
| 5,291,065 A | * | 3/1994 | Arai et al. .................... 257/723 |
| 5,422,440 A | | 6/1995 | Palma ...................... 174/133 B |
| 5,459,356 A | | 10/1995 | Schulze et al. ............. 257/773 |
| 5,508,560 A | | 4/1996 | Koehler et al. ............. 257/730 |
| 5,541,453 A | * | 7/1996 | Stockmeier et al. ........ 257/723 |
| 5,686,758 A | * | 11/1997 | Arai et al. .................... 257/693 |
| 5,751,058 A | * | 5/1998 | Matsuki ....................... 257/692 |
| 5,756,935 A | * | 5/1998 | Balanovsky et al. ....... 174/52.1 |
| 6,072,707 A | | 6/2000 | Hochgraf ...................... 363/71 |
| 6,078,173 A | | 6/2000 | Kumar et al. ............. 324/158.1 |
| 6,078,501 A | * | 6/2000 | Catrambone et al. ....... 361/704 |
| 6,212,087 B1 | | 4/2001 | Grant et al. ................. 363/144 |
| 6,292,371 B1 | * | 9/2001 | Toner, Jr. ..................... 361/752 |
| 6,297,549 B1 | * | 10/2001 | Hiyoshi ....................... 257/703 |
| 6,359,331 B1 | * | 3/2002 | Rinehart et al. ............ 257/691 |
| 6,434,008 B1 | * | 8/2002 | Yamada et al. ............. 361/728 |
| 2002/0034088 A1 | | 3/2002 | Parkhill et al. ............. 363/144 |
| 2002/0167828 A1 | | 11/2002 | Parkhill et al. ............. 363/144 |

FOREIGN PATENT DOCUMENTS

| | | | |
|---|---|---|---|
| EP | 0 427 143 A2 | 5/1991 | |
| EP | 0 578 108 | 1/1994 | |
| JP | 09117126 A | * 5/1997 | ............ H02M/1/00 |

OTHER PUBLICATIONS

English Abstract of EP 0 427 143 A2, esp@ce.net database, May 15, 1991.
Mohan et al., *Power Electronics: Converters, Applications and Design*, John Wiley & Sons Inc., United States, 1989, Chapter 26–8, "Circuit Layout", p. 654.

* cited by examiner

*Primary Examiner*—Kamand Cuneo
*Assistant Examiner*—Tuan Dinh
(74) *Attorney, Agent, or Firm*—Seed IP Law Group PLLC

(57) ABSTRACT

A DC bus for use in a power module includes a positive DC conductor bus plate parallel with a negative DC conductor bus plate. The positive bus and negative bus permit counter-flow of currents, thereby canceling magnetic fields and their associated inductances, and the positive and negative bus are connectable to the center portion of a power module.

15 Claims, 8 Drawing Sheets

SECTION B-B

Section B-B ( Detail )

SECTION A-A

SECTION B-B

SECTION C-C

SECTION D-D

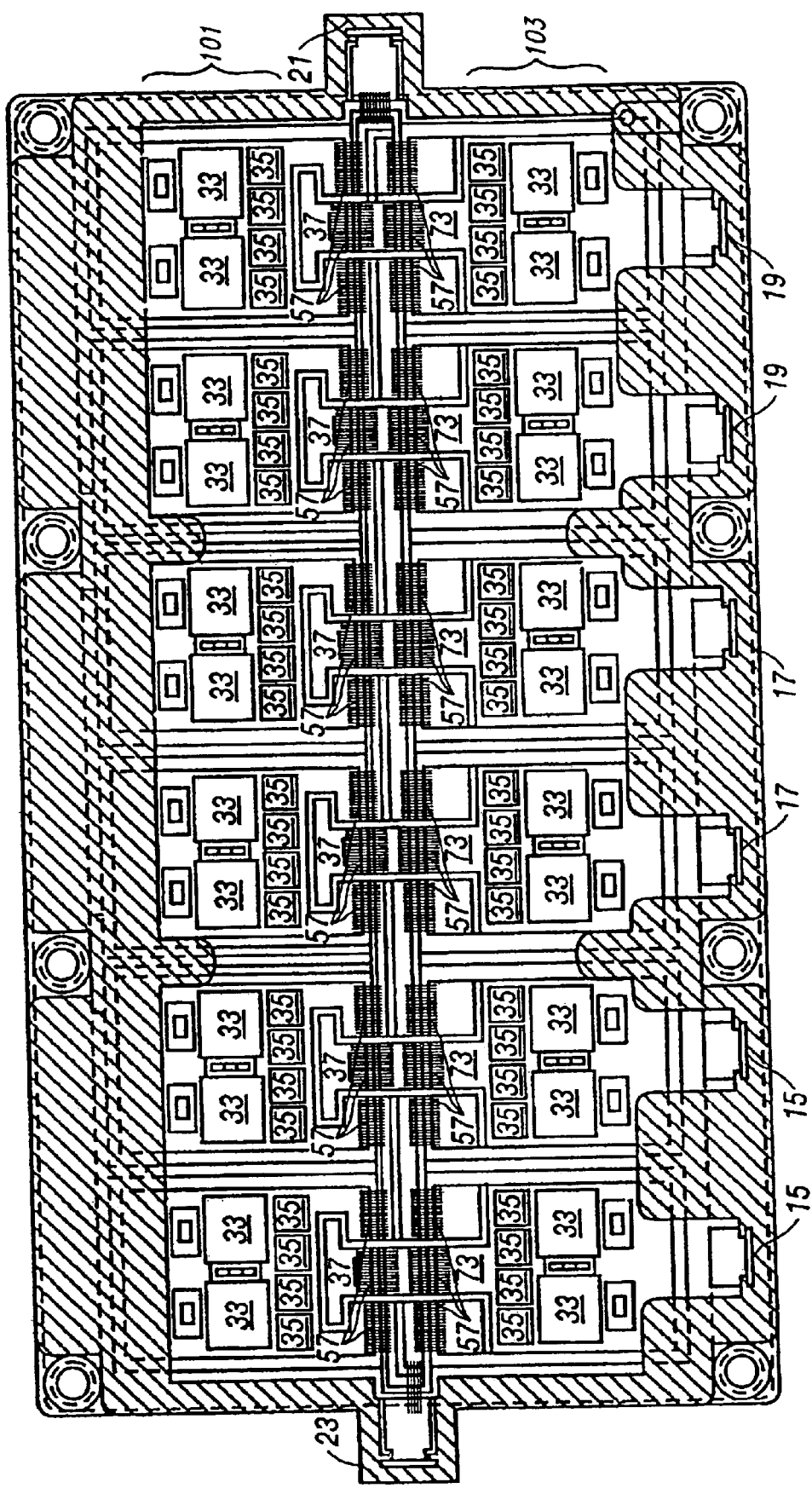

SECTION B-B

DC-POSITIVE
CONDUCTING
LAYER

Section B-B ( Detail )

SUBSTRATE-LEVEL DC BUS DESIGN TO REDUCE MODULE INDUCTANCE

CROSS REFERENCE TO RELATED APPLICATIONS

This is a continuation-in-part of co-pending application Ser. No. 09/882,708, filed Jun. 15, 2001 ABN, application Ser. No. 09/882,708 is hereby incorporated by reference herein in its entirety.

This application is related to and claims the priority to U.S. Provisional Application No. 60/233,995, filed Sep. 20, 2000, and entitled, "Leadframe-Based Module DC Bus Design to Reduce Module Inductance," U.S. Provisional Application No. 60/233,996, filed Sep. 20, 2000, and entitled, "Substrate-Level DC Bus Design to Reduce Module Inductance," U.S. Provisional Application No. 60/233,993, filed Sep. 20, 2000, and entitled, "EMI Reduction in Power Modules Through the Use of Integrated Capacitors on the Substrate Level," U.S. Provisional Application No. 60/233,992, filed Sep. 20, 2000, and entitled, "Press (Non-Soldered) Contacts for High Electrical Connections in Power Modules," and U.S. Provisional Application No. 60/233,994, filed Sep. 20, 2000, and entitled, "Both-Side Solderable Power Devices to Reduce Electrical Interconnects." Each of the above applications is hereby incorporated by reference herein in its entirety.

BACKGROUND OF THE INVENTION

1. Field of the Invention

The invention relates to the field of electronics. More specifically, the invention relates to direct current buses ("DC buses") used in power modules.

2. Background of the Invention

An inverter is commonly used to convert direct current ("DC") to alternating current ("AC") to power a three-phase load, such as a three-phase motor, or, alternatively, to convert AC from a three-phase source to DC. The inverter commonly contains six switches. Power modules often contain one or more pairs of complementary switches. The power module typically includes silicon dice on substrates that are secured to the module baseplate. Each switching pair has a positive or "high" side switch and a negative or "low" side switch for controlling the flow of electric current. Each switching pair is referred to herein as a "half bridge." The "high side" of the bridge contains the positive switches, and the "low side" contains the negative switches. By the term "switch" is meant a switching device such as an insulated gate bipolar transistor ("IGBT") or Bipolar Junction Transistor ("BJT") or Metal Oxide Semiconductor Field Effect Transistor ("MOSFET"), either singly or in parallel.

Elements may be described herein as "positive" or "negative." An element described as "positive" is shaped and positioned to be at a higher relative voltage than elements described as "negative" when the power module is connected to a power source. "Positive" elements are positioned to have an electrical connection that is connectable to the positive terminal of a power source, while "negative" elements are positioned to have an electrical connection that is connectable to a negative terminal, or ground, of the power source. Generally, "positive" elements are located or connected to the high side of the power module and "negative" elements are located or connected to the low side of the power module.

In a typical power module configuration, the high side switches are on one side of the module opposite the corresponding low side switches. A positive DC lead from a power source such as a battery is connected to a conducting layer in the high side of the substrate. Likewise, a negative DC lead from the power source is connected to a conducting layer in the low side of the substrate. The high side switches control the flow of current from the conducting layers of each high side substrate to output leads. Output leads, called "phase terminals" transfer alternating current from the three pairs of switches, or half bridges, to the motor.

Power modules typically have three half bridges combined into a single three-phase switching module, or single half-bridge modules that may be linked together to form a three-phase inverter. As would be understood by one of ordinary skill in the art, the same DC to AC conversion may be accomplished using any number of half bridges, which correspond to a phase, and each switching pair may contain any number of switching devices. For simplicity and clarity, all examples herein use a common three phase/three switching pair configuration. However, the invention disclosed herein may be applied to a power module having any number of switches.

Current flows from the power source through the positive DC lead to the conducting layer on the high side substrate. Current is then permitted to flow through one or more switching device on the high side to a conducting layer, commonly referred to as a phase output layer, on the low side. A phase terminal lead allows current to flow from this conducting layer on the low side to the motor. The current then flows from the motor to the corresponding conducting layer on the low side of a second switching pair through the low side switches and diodes to the negative DC lead to the power source.

Current flowing through various inductive paths within the module transiently stores energy which increases energy loss, reduces efficiency, and generates heat. When the flow of current changes, as in such a high frequency switching environment, large voltage overshoots often result, further decreasing efficiency. In addition, the DC terminals are commonly attached to one end of the power module, which forces current to travel further to some switches for some switching configurations, than for others, resulting in non-uniform current loops. Current loops that are not uniform result in uneven or inefficient motor performance. Additional materials regarding efficient configurations of power modules may be found in application Ser. No. 09/957,042, entitled "Press (Non-soldered) Contacts for High Current Electrical Connections in Power Modules," application Ser. No. 09/957,001, entitled "EMI Reduction in Power Modules through the Use of Integrated Capacitors on the Substrate Level," and application Ser. No. 09/882,708 entitled "Leadframe-based Module DC Bus Design to Reduce Module Inductance" filed Jun. 15, 2001, which are hereby incorporated by reference in their entirety.

These and other problems are avoided and numerous advantages are provided by the device described herein.

BRIEF SUMMARY OF THE INVENTION

The present invention provides a DC bus for use in a power module that is shaped and positioned to minimize the current loops, thus reducing inductive power losses. The DC bus is also shaped to permit counter-flow of electric currents, thereby canceling magnetic fields and their associated inductances. The DC bus also allows DC current to flow symmetrically and directly to the switches of the module. Symmetric current loops in the module result in more even and efficient motor performance.

Elements may be described herein as "adjacent" to another element. By the term "adjacent" is meant that in a relationship so characterized, the components are located proximate to one another, but not necessarily in contact with each other. Normally there will be an absence of other components positioned in between adjacent components, but this is not a requirement. By the term "substantially" is meant that the orientation is as described, with allowances for variations that do not affect the cooperation and relationship of the so described component or components.

In accordance with the present invention, the DC bus for use in a power module includes a positive DC conductor bus plate and a negative DC conductor bus plate placed parallel to the positive bus. The positive bus plate and the negative bus plate are configured for placement substantially centered with respect to a power module.

In another aspect, the negative bus plate and the positive bus plate are configured for placement substantially proximate to a substrate level in a power module. In yet another aspect, the positive bus plate and the negative bus plate are configured for placement substantially parallel to a substrate level in a power module.

In one aspect, the negative bus plate includes a negative extended portion configured for providing an area to which an electrical connection may be made. In another aspect, the positive bus plate includes a positive extended portion configured for providing an area to which an electrical connection may be made. The positive or negative extended portions provide an area in which an electrical connection, such as a wire bond connection, may be made.

In yet another aspect, the DC bus includes a negative bus plate, a positive bus plate, and a phase conducting layer. The phase conducting layer is connectable to the high side and the low side phase conducting layers of a substrate. In still another aspect, the DC bus includes an insulating layer located substantially between said positive bus plate and said negative bus plate.

In another aspect of the invention, a DC bus for use in a power module is disclosed. The module includes a positive DC conductor bus plate, a negative DC conductor bus plate placed parallel to the positive bus plate. A positive lead is electrically connected to the positive bus plate and is connectable to a positive terminal, and a negative lead is connected to the negative bus plate and is connectable to a positive terminal. A positive connection is fastenable from the positive bus plate to a high side substrate of a power module, and a negative connection is fastenable from the negative bus plate to the low side of a power module. The positive bus plate and the negative bus plate permit counter-flow of currents, thereby canceling magnetic fields and their associated inductances. The positive bus plate and the negative bus plate are configured to be placed between the high side and the low side of a power module, and the positive bus and the negative bus are shaped to be connected substantially parallel to the substrate of the power module.

In another aspect of the invention, a power module for reducing inductance is disclosed. The module includes a lead frame for supporting the module and for providing interconnections to the motor and the power source. A substrate is electrically connected to the lead frame. There are one or more pairs of high and low switches at the substrate level of the module. The DC bus described above is placed in the center portion of the power module.

In yet another aspect, the invention is directed to a method of reducing inductance in a power module. The method involves allowing DC current to flow symmetrically and directly to the switches of the module and permitting counter-flow of electric currents, thereby canceling magnetic fields and their associated inductances. The positive and negative leads are positioned in close proximity to one another thereby canceling the magnetic fields and associated inductances.

The DC bus and power module disclosed herein provide improved efficiency and more even motor performance through the cancellation of magnetic fields and minimization of current loops. A parallel negative and positive DC bus provides the added benefit of creating capacitance between the plates, which further minimize voltage overshoots produced by the switching process. These and other advantages will become apparent to those of ordinary skill in the art with reference to the detailed description and drawings.

BRIEF SUMMARY OF THE DRAWINGS

FIG. 10 is a top section view of the module showing the substrates and bus structure without the printed circuit board.

DETAILED DESCRIPTION OF THE INVENTION

In accordance with the invention, a DC bus is used in a power module, and the DC bus is shaped and positioned to minimize current loops, voltage overshoots and their associated inductance losses, and to provide for symmetric current flow. Reference is made herein to a power module with three phase terminals for use with a three-phase motor and having three bridges, each with two switching pairs. As will be appreciated by one of ordinary skill in the art, the disclosed power module, DC bus, and method for reducing inductance in a power module could be used on a power module with any number of phase terminals and bridges, and having any number of switching pairs. Nonetheless, for ease of description, reference is made to a three-phase power module.

Figure 1:
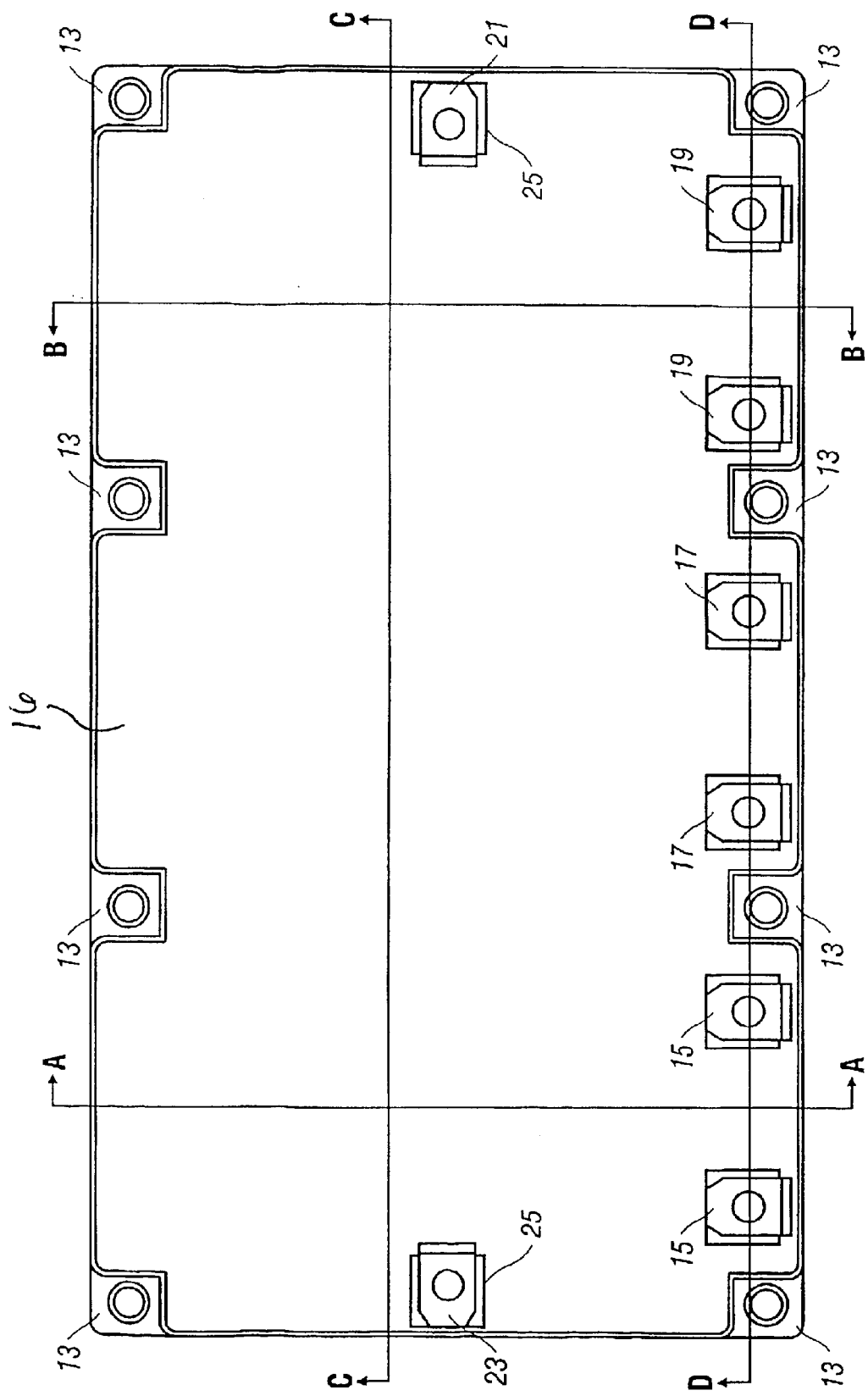
FIG. 1 is an overhead view of the top of the power module.

Referring to FIG. 1, an overhead view of the top of the power module is shown. The module has a positive lead 21 that is connectable to a power source, such as a battery, and a negative lead 23 that is likewise connectable to the negative terminal of a power source such as a battery, or ground. The module has three sets of phase terminals 15, 17, and 19. The cover 16 of the power module is held in place by adhesive. The module is attached to a coolant header or mounting by fasteners (not shown) through bushings 13. The fasteners are bolts, but other types of fasteners can be substituted therefore, as will be readily apparent to those of ordinary skill in the art. A non-conducting strip 25 holds leads 21 and 23 in place by providing a raised portion into which the leads 21 and 23 may be bolted.

As will be understood by one of ordinary skill in the art, the positive leads 21 and negative leads 23 carry direct current from a battery source to the module. As will be better understood by the following discussion, the power module converts the direct current to alternating current, or alternating current to direct current. In a three-phase module such as that shown in FIG. 1, there are at lease three phase terminals 15, 17 and 19 through which the resulting alternating current flows. In the preferred embodiment, there are three sets of two phase terminals 15, 17, and 19.

Figure 2:
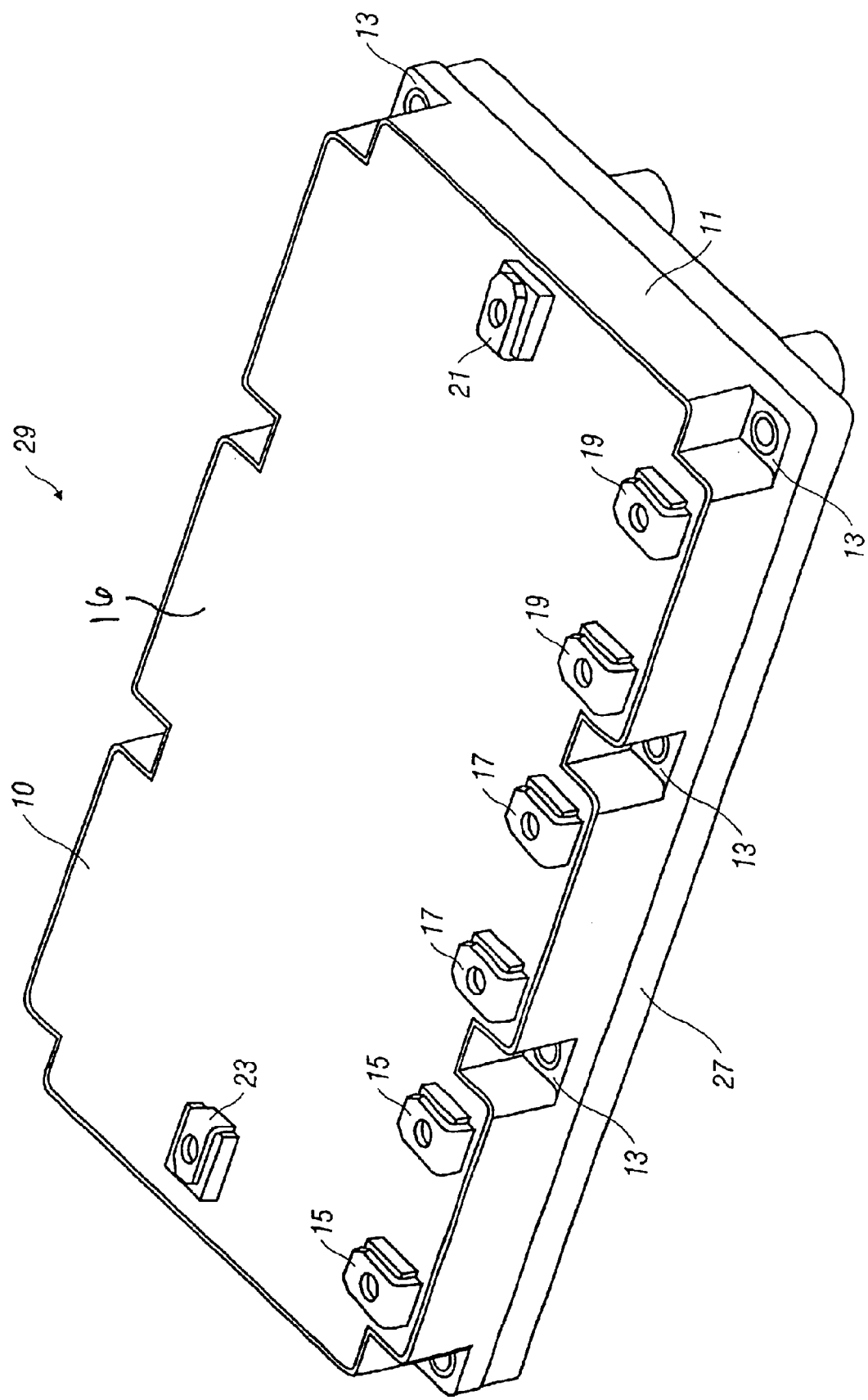
FIG. 2 is a perspective view of the power module.

FIG. 2 is a perspective view of the power module 29. The module has a module frame 11 and top cover 10, which are preferably composed of plastic. The bottom portion is the cooling header 27 of the module, into which a cooling liquid enters, circulates through, and exits, for cooling the module. Sandwiched between the module frame 11 and the cooling header 27 middle portion is the base plate, which contains the printed circuit board, substrate, and switching devices, and is not shown in this view. FIG. 2 shows the positive lead 21 and negative lead 23, and phase terminals 15, 17, and 19. The module frame 11 is bolted to the cooling header 27 with bushings 13.

Figure 3:
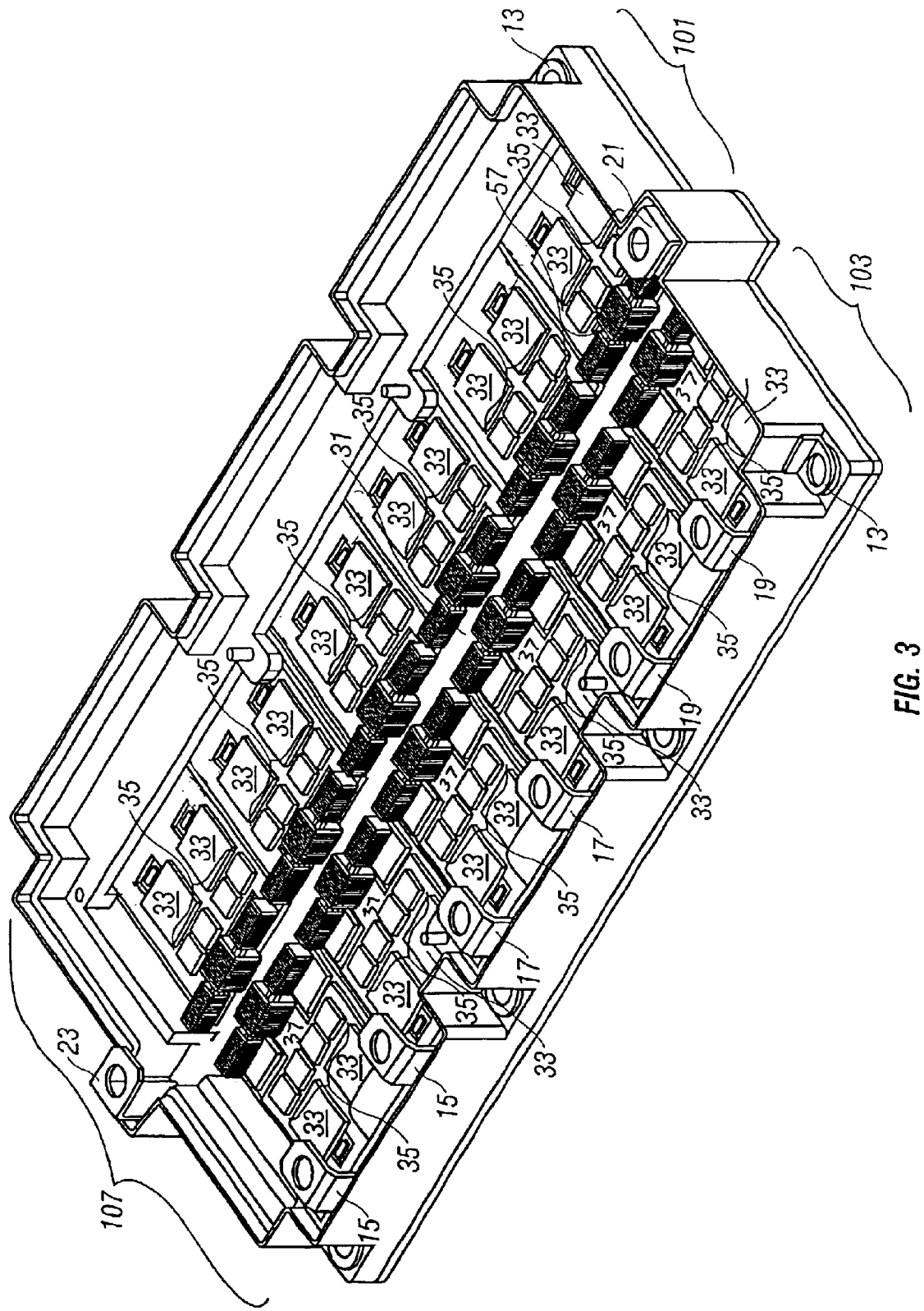
FIG. 3 is a perspective view of the power module without its top portion and with the substrates exposed.

FIG. 3 is a perspective view of the power module, shown without its top cover portion 10 and with the printed circuit board removed. The DC bus 31 has a separate positive bus plate and a negative bus plate, as is better illustrated in FIGS. 4–6 and 11. The DC bus 31 is arranged parallel to the substrates 107. As would be understood by one of ordinary skill in the art, the substrates have conducting layers separated by an insulating layer for carrying and controlling a current flow. The substrate 107 has a high side 101 and a low side 103. Switches 33, which can be IGBTs, MOS, or MOSFETs, and diodes 35 for controlling current flow are electrically connected to the substrate 107. The switches 33 are preferably IGBTs. The switches 33 and diodes 35 are electrically connected, preferably by wire bonding.

As will be understood by one of ordinary skill in the art, direct current flows from a power source such as a battery to the positive DC leads 21 and to the positive layer of DC conductor bus plates 31. Current flows to a conducting layer in the high side 101 of the power module. The current flows through the switches 33 and diodes 35 on the high side 101 through a conducting plate 37. The conducting plate 37 is connected to a conducting layer in the low side 103 of the power module by a phase conducting layer through the parallel bus bar. The phase conducting layer is shown in FIG. 11. Current then flows from the conducting layer on the low side 103 through one of the sets of phase terminals 15, 17, or 19 to a three-phase motor (not shown). Current from the motor flows back to another set of phase terminals 15, 17, or 19, where it flows from the conducting layer on the low side 103 through the low side switches 33, 35 to the negative lead 23 of the bus bar 31 and back to the power source.

FIG. 3 also shows pairs of phase terminals 15, 17, and 19. Three single phase terminals may be substituted for phase terminal pairs 15, 17, and 19. Alternatively, each phase terminal grouping, shown as pairs 15, 17, and 19, may include more than two phase terminals. Pairs of phase terminals 15, 17, and 19 are used for ease of connecting to switches 33 on the high side 103 of the power module.

A positive DC lead 21 and a negative DC lead 23 are also shown. Each lead 21 and 23 is placed central to a switching substrate corresponding to each of the phase terminals 15, 17, or 19. Although other lead configurations are possible, this placement of DC leads 21 and 23 provides for current flow to the ends of the positive bus plate and negative bus plate for convenience of connection.

Figure 4:
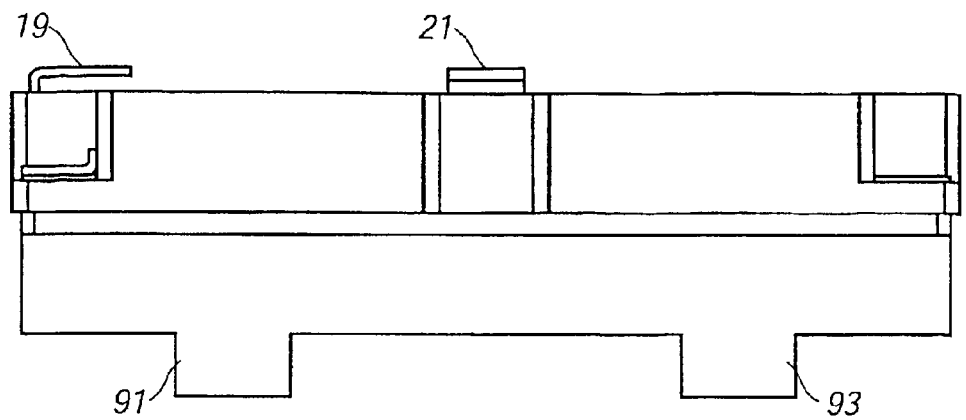
FIG. 4 is the side view of the power module.

FIG. 4 is a side view of the power module, with DC leads 21 and 23, phase terminal 15, and module frame 11. The bottom cooling header 27 includes an intake for coolant 91 and an outlet for coolant 93.

Figure 5:
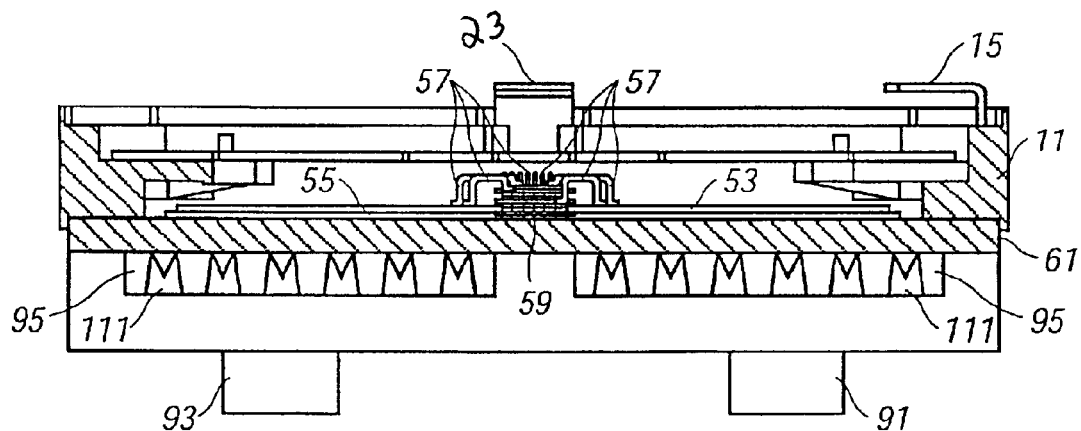
FIG. 5 is a cross-sectional front view of the power module with cooling intake and outlet.

Referring now to FIG. 5, a cross-sectional front view of the power module with cooling intake 91 and outlet 93 is shown. The cooling header 27 includes a cavity 95 through which a coolant, such as water, may flow. The cavity 95 includes thermal conducting projections 111. The cooling header 27 is fastened to the base plate 61, which supports the high side switching assembly 55 and low side switching assembly 53. The high side switching assembly 55 and low side switching assembly 53 comprise a single half bridge. The phase terminal 15 is also shown. FIG. 5 illustrates the cross section of the DC bus at the point having a positive DC lead 21. The DC bus has conducting layers 59 arranged parallel to the high and low side switching assemblies 55 and 53, respectively. The conducting layers 59 of the DC Bus are shown in more detail in FIGS. 11a and 11b, and include a positive plate, a negative plate, and a phase conducting layer. Connectors 57 connect the various conducting layers 59 of the DC Bus to corresponding conducting layers in the high side switching assembly 55 and the low side switching assembly 53. The conducting layers are separated by electrically insulating layers, preferably made from plastic or tape, shown in more detail in FIGS. 11a and 11b. Alternatively, enough space may be left between the conducting layers to provide an insulating layer of air or silicone gel. The electrically insulating layers permits more uniform spacing and closer spacing between the conducting layers.

Because the positive plate and negative plate within the conducting layers 59 are parallel, counter flow of current is permitted, thereby canceling the magnetic fields and their associated inductances. In addition, the parallel bus plates in the conducting layers 59 create capacitance. As will be understood by one of ordinary skill in the art, a capacitor dampens voltage overshoots that are caused by the switching process. Thus, the conducting layers 59 create a magnetic field cancellation as a result of the counter flow of current, and capacitance damping as a result of also establishing a functional capacitance between them. FIG. 5 shows the DC bus plates 57 and 59 placed parallel to the high side 55 and low side 53 substrates, however, the DC bus plates 57 and 59 may also be placed perpendicular to the substrates 53 and 55 and still achieve counter flow of current and reduced inductances, as described in more detail in application Ser. No. 09/882,708.

The cooling system is further illustrated in FIG. 5. Heat produced by the power module is conducted through the base plate 61 and the conducting projections 111 to the coolant cavities 95. Coolant flows into the coolant intake 91, through the cavities 95, and out coolant outlet 93, thereby dissipating heat energy from the power module.

Figure 6:
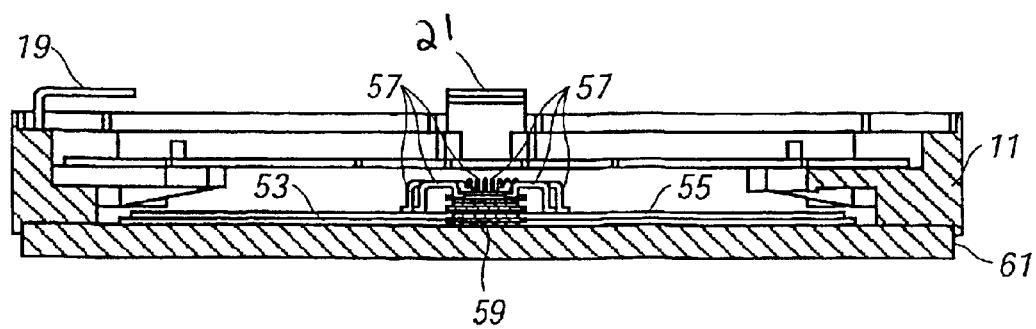
FIG. 6 is a cross-sectional front view of the power module without cooling intake and out take.

Referring now to FIG. 6, a cross-sectional front view of the power module without cooling intake and out take is shown.

Figure 7:
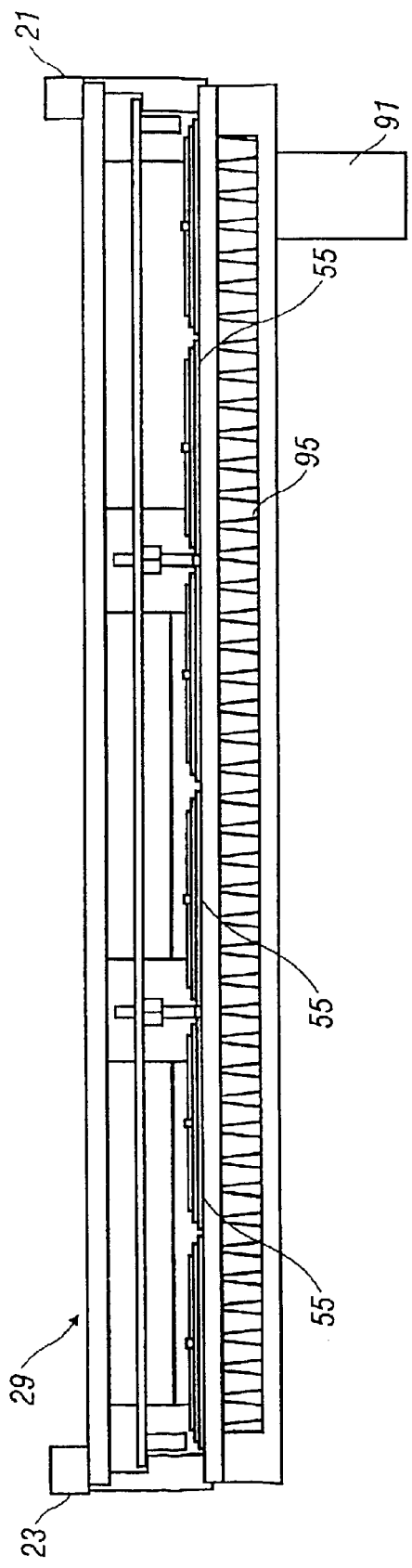
FIG. 7 is a cross-sectional side view of the power module viewed through the DC bus leads.

Turning now to FIG. 7, a cross-sectional side view of the power module is shown. The coolant cavity 95 runs the length of the module to intake 91. The high side substrate switches 55 are shown inside the module 29 with positive DC lead 21 and negative DC lead 23.

Figure 8:
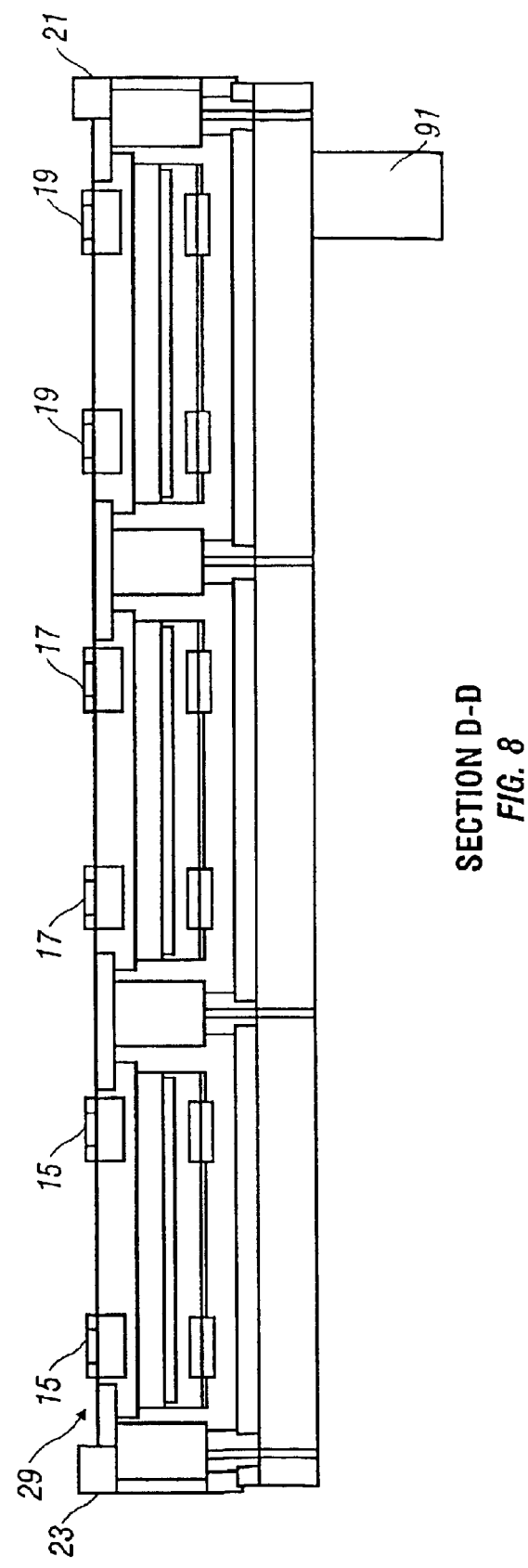
FIG. 8 is a cross-sectional side view of the power module viewed through the phase terminals.

FIG. 8 is a cross-sectional side view of the power module viewed through the phase terminals 15, 17, and 19 and depicting positive DC bus lead 21 and negative DC bus lead 23.

Figure 9:
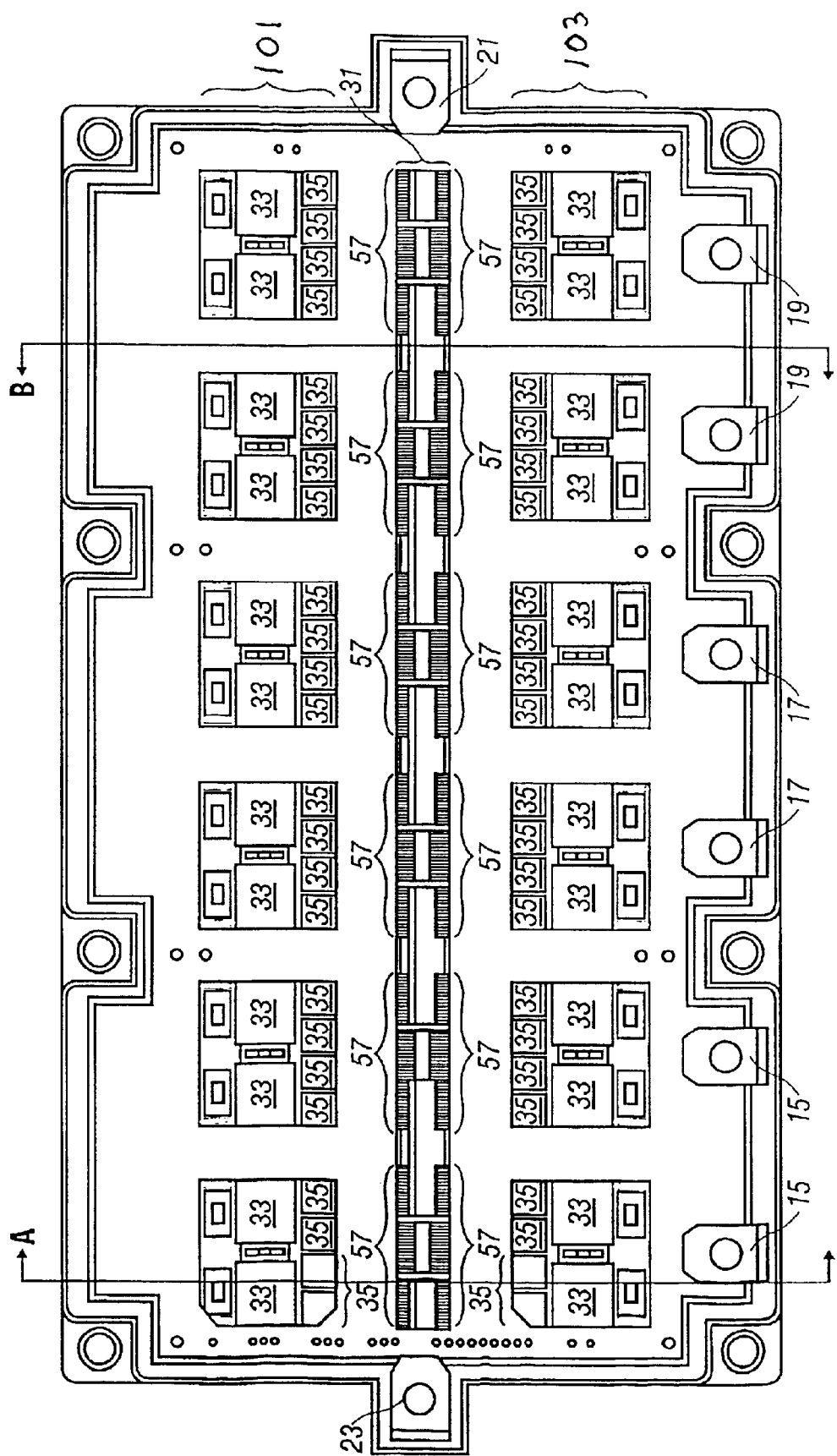
FIG. 9 is a top section view of the module with a printed circuit board for switching signal circuitry in place.
Figure 11A:
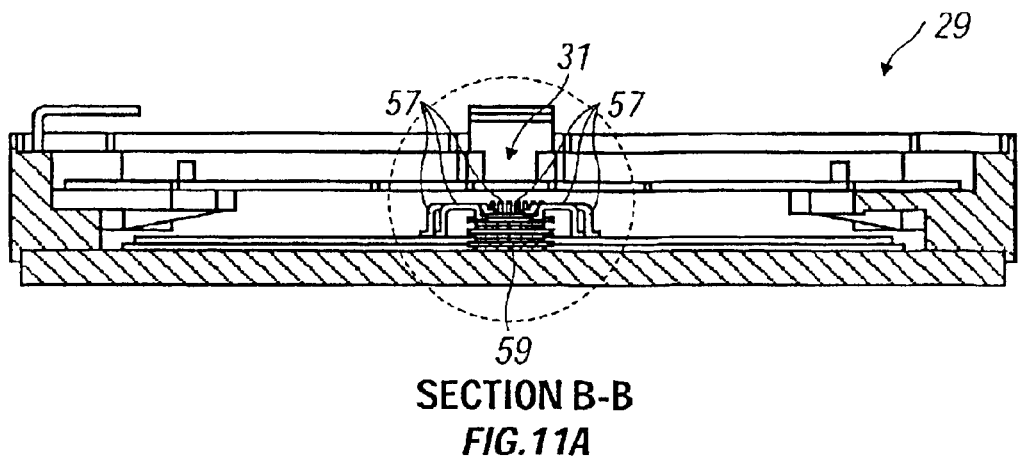
FIG. 11a is a cross-sectional view of the power module and DC bus.
Figure 11B:
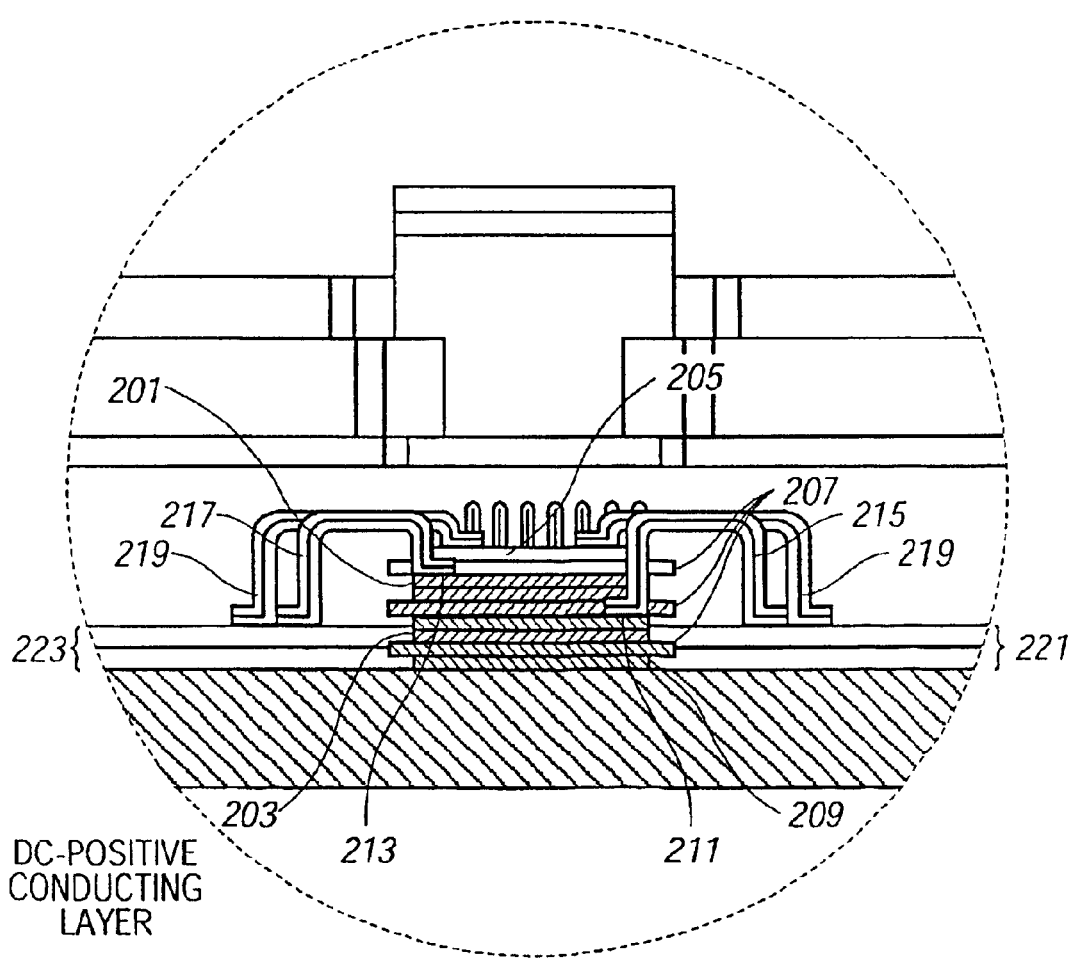
FIG. 11b is an enlarged cross-sectional view of the DC bus.

FIG. 9 is a top section view of the printed circuit board illustrating switching devices 33 and diodes 35 on the substrate of the module as viewed through cutouts in the printed circuit board. The DC bus 31 is shown in the center of the module. Positive lead 21, negative lead 23 and phase terminals 15, 17, and 19 are also shown. Various conducting layers in the DC bus 31 are connected to conducting layers in the module by connections 57.

Referring now to FIG. 10, a top section view of the module below the printed circuit board is shown. The DC bus 31 is shown placed in the middle of the module for symmetric flow of current to both sides of switches 33 and diodes 35. The DC bus 31 has conducting layers, including a positive bus plate, a negative bus plate, and a phase conducting layer, shown in more detail in FIGS. 11a and 11b. The conducting layers of the DC bus 31 are connected to the high side 101 and the low side 103 through connections 57. The connections 57 are preferably wire bonds, but other connections may be substituted for wire bonds. The phase conducting layer of the DC bus 31 allows current to flow from the high side 101 to the low side 103 through connections 57.

Substrate switches 33 and diodes 35 are shown on a printed circuit board. As would be apparent to one of ordinary skill in the art, the current must be able to flow from the conducting layer on the high side 101 of the substrate to the conducting layer on the low side 103 of the substrate. The current flows from a conducting layer of the substrate on the high side 101, through the switches 33 and diodes 35 to a conducting plate 37. The conducting plate 37 is connected to the DC bus 31, and more specifically to the phase conducting layer of the DC bus, through connections 57. The phase conducting layer of the DC bus is also connected through connections 57 to a second conducting plate 73 on the low side 103 of the module. In other words, the high side 101 is connected to the low side 103 through conducting plate 37 via connections 57 to the phase conducting layer of the DC bus 31. The phase conducting layer of the DC bus 31 is in turn connected to the second conducting plate 73 on the low side 103 via connections 57.

FIG. 11 is a detailed cross sectional view of the power module 29 and DC bus 31, including conducting layers 59 and connections 57. The conducting layers 59 of the DC bus include negative conducting plate 201, which is connectable to a negative lead 23 at one end of the DC bus, and a positive conducting plate 203, which is connectable to a positive lead 21 at a second end of the DC bus. The positive lead and negative lead 21 and 23 are shown in FIGS. 1–3, 7–10. The positive bus plate 203 in FIG. 11 may be connected, preferably by a wire bond, to the high side conducting layer of the substrate 221. Similarly, the negative bus plate 201, may be connected, preferably by a wire bond, to the low side conducting layer of the substrate 223.

As would be understood by one of ordinary skill in the art, an exposed surface is needed to form a wire bond connection. Preferably, the positive bus plate 203 includes a positive extended portion 211 for providing an area to which an electrical connection may be made, and the negative bus plate 201 includes a negative extended portion 213 for providing an area to which an electrical connection may be made. The exposed area provided by the positive and negative extended portions 211 and 213 must be sufficient for electrically connecting a connector, such as a wire bond, to the positive and negative extended portions 211 and 213. Preferably, the size of the positive and negative extended portions 211 and 213 is at least about three millimeters.

The connectors 57, shown in detail as connectors 215, 217, and 219, connect layers of the DC bus 31 to layers in the substrate 221 and 223. Connector 215 forms an electrical connection between the positive extended portion 211 of the positive bus plate 203 and a conducting layer in the high side substrate 221. Connector 217 forms an electrical connection between the negative extended portion 213 of the negative bus plate 201 and a conducting layer in the low side substrate 223. Connectors 219 form an electrical connection between the phase conducting layer 205 and a phase conducting layer in the high side and low side substrates 221 and 223. Preferably, connectors 215, 217, and 219 are wire bond connectors, however, other types of connectors may be used.

Because the negative plate 201 and positive plate 203 are parallel to one another, the counter-flow of electricity is permitted, resulting in field cancellation. In addition, the parallel position of the negative plate 201 and positive plate 203 create capacitance, therefore reducing voltage overshoots.

Insulating layers 207 electrically insulate the positive bus plate 203, the negative bus plate 201, and the phase conducting layer 205. The soldered metal layer 209 provides a support for the positive bus plate 203, the negative bus plate 201, and the phase conducting layer 205.

As would be understood by one of ordinary skill in the art, various other configurations of the positive bus plate 203, the negative bus plate 201, and the phase conducting layer 205 in the DC bus 31 are possible. For example, the order of the positive plate 203, the negative plate 201, and the phase conducting layer 205 may be changed without substantially affecting the function of the DC bus 31.

The figures disclosed herein are merely exemplary of the invention, and the invention may be embodied in various and alternative forms. The figures are not necessarily to scale. Some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

Having thus described the invention, the same will become better understood from the appended claims in which it is set forth in a non-limiting manner.

What is claimed is:

1. A DC bus bar structure for use in a power module, comprising:
   an elongated substantially planar first bus plate, the first bus plate comprising at least an upper surface;
   a first insulating layer overlying a portion of the upper surface of the first bus plate and exposing a wire bonding area on the upper surface, the bonding area extending along at least a portion of one edge of the upper surface of the first bus plate; and
   an elongated substantially planar second bus plate, the second bus plate comprising at least an upper surface comprising an exposed wire bonding area extending along at least a portion of one edge of the upper surface of the second bus plate, the second bus plate overlying at least a portion of the first insulating layer and positioned parallel to the first bus plate such that the upper surface of the first bus plate and the upper surface of the second bus plate are parallel and face a same direction, and where the second bus plate is spaced from the first bus plate by the first insulating layer; and wherein the first and second bus plates are physically positioned between a high side and a low side of the power module, a first set of wire bonds electrically coupling the bonding area of the first bus plate to one of the high side and the low side of the power module, and a second set of wire bonds electrically coupling the bonding area of the second bus plate to the other one of the high side and the low side of the power module.

2. The DC bus bar structure of claim 1, further comprising:
a second insulating layer overlying a portion of the upper surface of the second bus plate, exposing the bonding area extending along at least the portion of the one edge of the upper surface of the second bus plate.

3. The DC bus bar structure of claim 1 wherein the bonding area extending along at least the portion of the one edge of the upper surface of the first bus plate and the bonding area extending along at least the portion of the one edge of the upper surface of the second bus plate are opposed to one another across a longitudinal axis of the DC bus bar structure.

4. The DC bus bar structure of claim 1, further comprising:
a first lead terminal electrically coupled to the first bus plate at one end thereof;
a second lead terminal electrically coupled to the second bus plate at one end thereof, the one end of the second bus plate being opposed to the one end of the first bus plate across a lateral axis of the DC bus bar structure such that current flow in the second bus plate is opposite in direction to current flow in the first bus plate.

5. A DC bus bar structure for use in a power module, comprising:
a substantially straight elongated first bus plate comprising a first surface and a second surface opposed to the first surface;
a substantially straight elongated second bus plate comprising a first surface and a second surface opposed to the first surface, the second bus plate positioned parallel and spaced from the first bus plate; and
a first insulating layer interposed between a portion of the first and the second bus plates, wherein the first bus plate, the second bus plate and the first insulating layer are disposed such that a first wire bonding area is exposed extending along at least a portion of the first surface of the first bus plate and a second wire bonding area is exposed extending along at least a portion of the first surface of the second bus plate;
wherein the first and second bus plates are physically positioned between a high side and a low side of the power module, a first set of wire bonds electrically coupling the first wire bonding area to one of the high side and the low side of the power module, and a second set of wire bonds electrically coupling the second wire bonding area to the other one of the high side and the low side of the power module.

6. The DC bus bar structure of claim 5, further comprising:
a second insulating layer overlying a portion of the first surface of the second bus plate, exposing the second wire bonding area of the second bus plate.

7. A power module comprising:
a substrate comprising at least a first surface;
a first set of switches coupled on the substrate to form at least a portion of a high side of the power module;
a second set of switches coupled on the substrate to form at least a portion of a low side of the power module;
an elongated first bus plate comprising at least an upper surface, the upper surface of the first bus plate approximately parallel with and facing a same direction as the first surface of the substrate;
a first insulating layer overlying a portion of the upper surface of the first bus plate, and exposing a bonding area extending along at least a portion of the upper surface of the first bus plate;
an elongated second bus plate comprising at least an upper surface, the upper surface of the second bus plate approximately parallel with and facing a same direction as the first surface of the substrate, the second bus plate overlying at least a portion of the first insulating layer and positioned parallel to and spaced from the first bus plate by the first insulating layer, and disposed over a portion of the upper surface of the first bus plate exposing a bonding area extending along at least a portion of one edge of the upper surface of the first bus plate;
a second insulating layer overlying a portion of the upper surface of the second bus plate, and exposing a bonding area extending along at least a portion of the upper surface of the second bus plate;
a first set of wire bonds electrically coupling the bonding area of the first bus plate to one of the high side and the low side of the power module; and
a second set of wire bonds electrically coupling the bonding area of the second bus plate to the other one of the high side and the low side of the power module;
wherein the high side of the power module is on a first portion of the first surface of the substrate and the low side of the power module is on a second portion of the first surface of the substrate, and the first and second bus plates are both positioned between the first and the second portions of the first surface of the substrate.

8. The power module of claim 7 wherein the bonding area of the first bus plate extends along at least a portion of an edge of the upper surface of the first bus plate and the bonding area of the second bus plate extends along at least a portion of an edge of the upper surface of the second bus plate.

9. The power module of claim 7 wherein the first and the second bus plates extend along an entire length of the substrate.

10. The power module of claim 7 wherein the first and the second sets of switches each comprise a respective row of twelve switches disposed along a length of the substrate, and the first and the second bus plates extend along an entire length of the rows of switches.

11. The power module of claim 7 wherein the first and the second bus plates are straight bars.

12. A power module comprising:
a substrate comprising at least a first surface;
a first set of switches coupled on the substrate to form at least a portion of a high side of the power module;
a second set of switches coupled on the substrate to form at least a portion of a low side of the power module;
an elongated first bus plate comprising at least an upper surface, the upper surface of the first bus plate approximately parallel with and facing a same direction as the first surface of the substrate;

a first insulating layer overlying a portion of the upper surface of the first bus plate, and exposing a bonding area extending along at least a portion of the upper surface of the first bus plate;

an elongated second bus plate comprising at least an upper surface, the upper surface of the second bus plate approximately parallel with and facing a same direction as the first surface of the substrate, the second bus plate overlying at least a portion of the first insulating layer and positioned parallel to and spaced from the first bus plate by the first insulating layer, and disposed over a portion of the upper surface of the first bus plate exposing a bonding area extending along at least a portion of one edge of the upper surface of the first bus plate;

a second insulating layer overlying a portion of the upper surface of the second bus plate, and exposing a bonding area extending along at least a portion of the upper surface of the second bus plate;

a first set of wire bonds electrically coupling the bonding area of the first bus plate to one of the high side and the low side of the power module; and a second set of wire bonds electrically coupling the bonding area of the second bus plate to the other one of the high side and the low side of the power module, wherein the bonding area extending along at least the portion of the upper surface of the first bus plate and the bonding area extending along at least the portion of the upper surface of the second bus plate are opposed to one another across a longitudinal axis of the first bus plate.

13. The power module of claim 12, further comprising:

a first lead terminal electrically coupled to the first bus plate at one end thereof; and a second lead terminal electrically coupled to the second bus plate at one end thereof, the one end of the second bus plate being opposed to the one end of the first bus plate across a lateral axis of the power module such that current flow in the second bus plate is opposite in direction to current flow in the first bus plate.

14. The power module of claim 13, further comprising:

a housing enclosing the substrate, the first and the second sets of switches, and the entirety of the first and the second bus plates except for the first and the second lead terminals.

15. The power module of claim 13, further comprising:

an approximately rectangular housing enclosing the substrate, the first and the second sets of switches, and the entirety of the first and the second bus plates except for the first and the second lead terminals, wherein the first and the second bus plates extend along a longitudinal axis of the housing.

* * * * *